United States Patent [19]

Ferrando et al.

[11] Patent Number: 5,380,598
[45] Date of Patent: Jan. 10, 1995

[54] SOLDER JOINT

[75] Inventors: Carlo Ferrando, Chippenham; Stephen Chan, Bristol, both of England

[73] Assignee: Westinghouse Brake & Signal Holdings Ltd., United Kingdom

[21] Appl. No.: 26,465

[22] Filed: Mar. 4, 1993

[30] Foreign Application Priority Data

Mar. 5, 1992 [GB] United Kingdom ............... 9204731

[51] Int. Cl.⁶ .................... B23K 1/20; H01L 23/14
[52] U.S. Cl. .................... 428/620; 428/641; 228/123.1; 228/124.1
[58] Field of Search ........... 428/620, 641, 651, 660, 428/661, 663; 228/123, 124, 208, 209, 123.1, 124.1, 262.8, 232; 257/740, 751, 770

[56] References Cited

U.S. PATENT DOCUMENTS

| | | | |
|---|---|---|---|
| 3,537,174 | 11/1970 | May | 228/123 |
| 3,555,669 | 1/1971 | Tarn | 228/123 |
| 4,513,905 | 4/1985 | Nowicki | 228/123 |
| 4,546,374 | 10/1985 | Olson et al. | 357/71 |
| 4,680,612 | 7/1987 | Hieber et al. | 428/620 |
| 4,772,935 | 9/1988 | Lawler et al. | 228/123 |
| 4,871,617 | 10/1989 | Kim et al. | 428/620 |
| 4,921,158 | 5/1990 | Hwang et al. | 228/124 |
| 5,170,242 | 12/1992 | Stevens et al. | 257/751 |

FOREIGN PATENT DOCUMENTS

| | | | |
|---|---|---|---|
| 62-42560 | 2/1987 | Japan | 257/740 |
| 2238267A | 5/1991 | United Kingdom | 228/208 |
| 82/02457 | 7/1982 | WIPO | 228/123.1 |

OTHER PUBLICATIONS

Babcock, S. E. et al., "Titanium-tungsten contacts to silicon. II. Stability against aluminum penetration", *J. Appl. Phys.*, 59(5) Mar. 2, 1986.

Jacobson, D. M. et al., "High power devices: fabrication technology and developments", *Metals and Materials*, Dec. 1991, pp. 733–739.

S. M. Sze, Semiconductor Devices–Physics and Technology, 1985, pp. 372–377.

C. Y. Ting et al., "The Use of Titanium-Based Contact Barrier Layers in Silicon Technology", This Solid Films, 96 (1987), pp. 327–345.

*Primary Examiner*—John Zimmerman
*Attorney, Agent, or Firm*—Nilsson, Wurst & Green

[57] ABSTRACT

A joint for joining a silicon disc (21) to a molybdenum disc (22) comprises a layer of titanium silicide (20) and a layer of aluminium-silicon solder (23). The titanium silicide is formed by depositing a layer of titanium on the silicon disc and heating the silicon disc and the titanium to around 550° C. to encourage the formation of titanium silicide. A solder disc is then compressed between the silicon and molybdenum discs at about 690° C. to fuse the solder to the titanium silicide layer and the molybdenum disc. The layer of titanium silicide protects the silicon disc from dissolution during soldering, so that diffused-in features in the silicon are not damaged.

14 Claims, 3 Drawing Sheets

PRIOR ART

SOLDER JOINT

BACKGROUND OF THE INVENTION

The present invention relates to solder joints between silicon members and members comprising a refractory metal, and a process for forming such joints. The invention may be employed, for example, in the manufacture of semiconductor devices.

In the manufacture of semiconductor devices, particularly high-power semiconductor devices, it is often desired to connect silicon semiconductor material to a heat sink of a high conductivity metal, for example copper. To help relieve thermal stress which may occur at such a connection it is conventional to join an intermediate member comprising a refractory metal, for example molybdenum, between the silicon semiconductor material and the high conductivity metal heat sink. Conventionally, the silicon and the refractory metal members are disc-shaped.

Aluminium has long been used as the solder metal for joining silicon and molybdenum discs together, the soldering being accomplished somewhat above the eutectic temperature of aluminium and silicon (577° C.). The aluminium may initially contain a proportion of silicon, typically the eutectic composition, 11.7% Si by weight, although pure aluminium may be used. In each case, material is normally dissolved from the surface of the silicon disc during the soldering process, although more is dissolved if pure aluminium is used as the solder than if the eutectic composition is used.

Another effect involves a reaction which occurs between the silicon content of the aluminium-silicon alloy and the molybdenum surface, and results in the formation of an interfacial layer of molybdenum disilicide. This denudes the aluminium-silicon alloy of some of its silicon content at the interface and the consequent concentration gradient causes transport of silicon from the silicon disc surface towards the molybdenum surface. Such further dissolution of the surface of the silicon disc is generally undesirable, especially as there is often a tendency for it to occur non-uniformly, resulting in stepped or spiked erosion of the silicon surface.

Further, aluminium, being a dopant in silicon, forms a specifically p-type contact with the silicon unless the total concentration of n-type counter-dopants (e.g. phosphorus) is sufficient to maintain approximately ohmic properties at the contact, through degeneracy of the silicon electronic band structure. This requirement imposes a combination of constraints on permissible dopant profiles and on alloying erosion (dissolution) effects, as described above, at the silicon to aluminium-silicon boundary. In particular, where the silicon dopant distribution includes small and critical features, it is vital that these shall not be lost by dissolution into the aluminium-silicon solder at the site of an irregularity (spike) in the alloying front.

FIG. 1 shows a typical section through a joint which has been formed using such a prior art method. A silicon disc 1 is shown attached to a molybdenum disc 2 by a layer of aluminium-silicon solder 3. It can be seen that the penetration of the solder layer 3 into the diffused silicon disc 1, is irregular as shown by reference numeral 4. In some small areas, the depth of penetration caused by the dissolution of silicon may cause diffused-in features in the silicon disc, such as n+type region 5, to be seriously eroded or even annihilated, with the most undesirable consequences. A layer of molybdenum disilicide 6 several microns in thickness forms between the solder 3 and the molybdenum disc 2.

A variety of techniques have been proposed to improve uniformity and reduce the silicon erosion at such soldering joints, for example producing the required bonding at the lowest possible temperature or coating the surface of the molybdenum component to inhibit the formation of molybdenum disilicides. Such techniques have often been less successful than might have been hoped. Other methods of forming the bond, such as diffusion soldering [Jacobson, D.M. and Humpston, G., High Power Devices: Fabrication Technology and Developments, Metals and Materials, December 1991] claim success but at the cost of some complexity.

An alternative approach, that of forming a barrier layer at the silicon surface in order to prevent the dissolution or modification of the dopant structure within the silicon has been proposed, mainly in connection with thin deposition films and VLSI technology, e.g. Babcock, S.E. and Tu, K.N., Journal of Applied Physics, vol. 59, No. 5, pp 1599–1605, March 1986. The technique therein disclosed does not, however, extend to the necessary area nor does it provide for the attachment of a heavy molybdenum supporting electrode, such as would be required by a large area power device extending up to 100 mm or so in diameter.

As prior art, there may also be mentioned GB-A-2 238 267 which discloses a process for brazing a silicon body to a metal body, the silicon body being provided with an adherent oxide film. The oxide film is coated with a metal layer structure which provides a brazable surface. Attack of the silicon surface by braze alloy is prevented by the oxide film. The metal layer structure comprises titanium, molybdenum and nickel. The braze is a silver/copper alloy.

SUMMARY OF THE INVENTION

According to the present invention from one aspect there is provided a joint structure which joins a silicon member to a member comprising a refractory metal, the joint comprising a layer of titanium silicide adjacent the silicon member and a layer of solder, containing aluminium as the principal constituent, lying between the layer of titanium silicide and the member comprising a refractory metal.

According to the present invention from another aspect there is provided a method for joining a silicon member to a member comprising a refractory metal, the method comprising providing the silicon member with a surface layer of titanium silicide and providing a layer of solder containing aluminium as the principal constituent between the layer of titanium silicide and the member comprising a refractory metal.

Advantageously, the member comprising a refractory metal contains molybdenum as the principal constituent.

The solder suitably contains silicon in the range from 10 to 15% by weight, preferably about 11.7% by weight (the eutectic composition).

Preferably, the silicon member is provided with the layer of titanium silicide by coating the silicon member with a layer of titanium and heating the silicon member and the layer of titanium to encourage the formation of titanium silicide. Preferably, the silicon member and the layer of titanium are heated to a temperature in the range from 500° to 700° C., more preferably in the range from 500° to 600° C. and most preferably about 550° C.

Preferably, the titanium silicide is principally composed of titanium monosilicide. The thickness of the layer of titanium is preferably about 1 μm.

Preferably, the layer of solder is provided by compressing a solder member between the titanium silicide layer and the member comprising a refractory metal and heating the solder member to fuse it to the titanium silicide layer and to the member comprising a refractory metal. Preferably, the fusing of the solder is accomplished at a temperature in the range from 577° to 760° C., more preferably in the range from 660° to 700° C. and most preferably about 690° C. The thickness of the layer of solder is preferably less than 50 μm and most preferably about 30 μm.

BRIEF DESCRIPTION OF THE DRAWINGS

The present invention will now be described, by way of example, with reference to the accompanying drawings, in which.

DESCRIPTION OF THE PREFERRED EMBODIMENTS

In the following example, a silicon disc which is to be joined to a molybdenum disc is provided with a layer of titanium silicide on the surface where the joint is to be made, and is joined to the molybdenum disc by a layer of aluminium-silicon solder.

Figure 1:
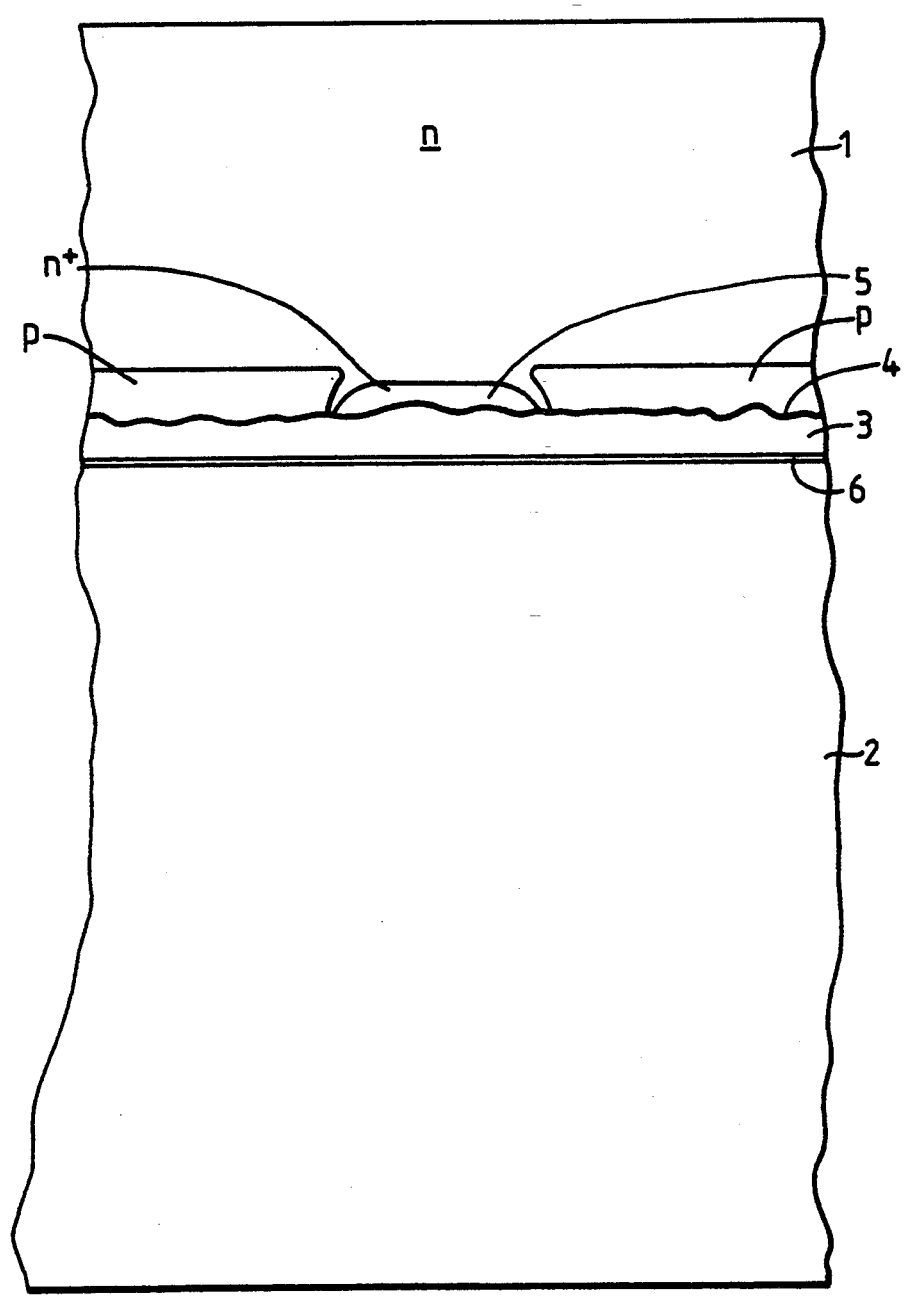
FIG. 1 is a fragmentary vertical cross-sectional view of a structure of the prior art which includes a solder joint.
Figure 2:
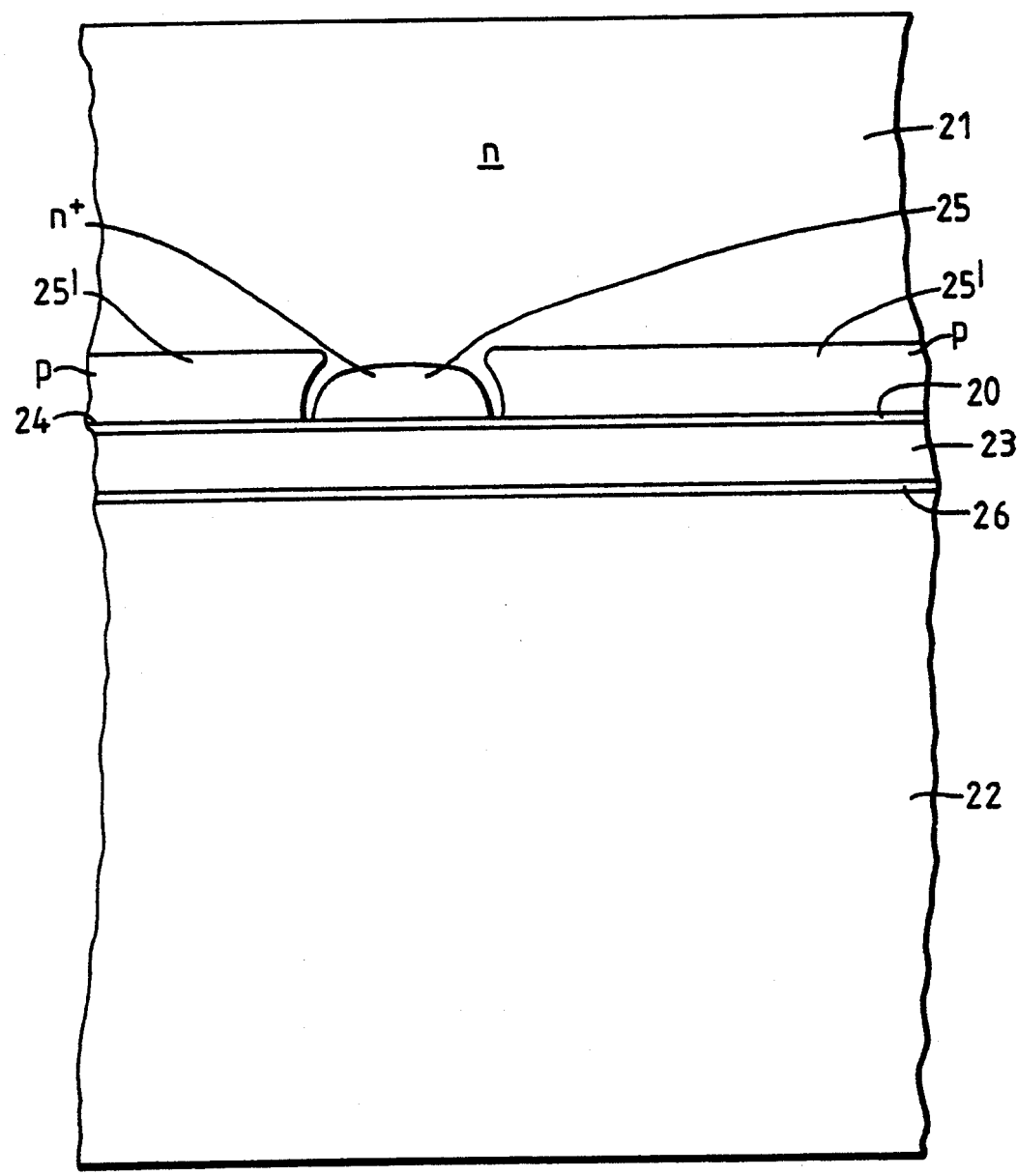
FIG. 2 is a fragmentary vertical sectional view of a structure formed according to a preferred embodiment of the present invention which includes a solder joint illustrated prior to fusing of the solder.

Such a structure is shown in FIG. 2. Referring to FIG. 2, a silicon disc 21 is provided with a coating 20 of titanium silicide. The silicon disc is joined, via that coating, to a molybdenum disc 22 by a layer of aluminium-silicon solder 23.

The process by which the structure of FIG. 2 may be achieved will now be described. The silicon disc 21, typically 50 mm in diameter and 600 μm thick, which may contain dopants to give desired diffused-in features 25 and 25', is prepared so as to be free from surface contamination, especially oxides. It is placed in a high vacuum evaporation apparatus in which titanium is vaporised by heating with a high energy electron beam so that titanium vapour condenses on to at least that surface of the silicon disc to which it is intended to attach a molybdenum support electrode. The titanium is typically deposited to a thickness of 1 μm. The interface between the titanium and the silicon is next modified by heating the disc to a temperature of at least 500° C. for a period in the range from 20 to 30 minutes in an atmosphere of nitrogen, although other suitably inert gases (e.g. hydrogen) would serve as well. Experiments showed that a satisfactory titanium-silicon reaction could be obtained with a temperature in the range from 500° to 700° C., the preference being for 500° to 600° C. and most preferably about 550° C. At higher temperatures, increasing amounts of the disilicide $TiSi_2$ are believed to be formed. $TiSi_2$ appears to have inferior resistance to attack by aluminium compared to the monosilicide TiSi formed predominantly in the 500° to 600° C. range. Similarly, to avoid the formation of $TiSi_2$, the reaction time should not be unduly prolonged.

After this temperature treatment, the silicon disc is attached by its titanium-coated face to a molybdenum disc of similar diameter and typically with a thickness in the range from 2 to 3 mm using a 30 μm thick solder disc of aluminium-silicon eutectic composition (11.7% silicon by weight) in a suitably inert or reducing atmosphere, e.g. nitrogen or hydrogen by compressing the solder disc between the silicon and molybdenum discs, at a moderate pressure, e.g. 300 pascals, and raising their temperature to 690° C. for a period of 10 to 20 minutes to fuse the solder disc to each of the other discs. Thereafter, the fused assembly is cooled, slowly through the range 570° down to 300° C. for reasons of stress relief. The fusing of the solder could be accomplished between 577° C. (the aluminium-silicon eutectic temperature) and about 700° C. but about 690° C. has been found to be preferable.

Figure 3:
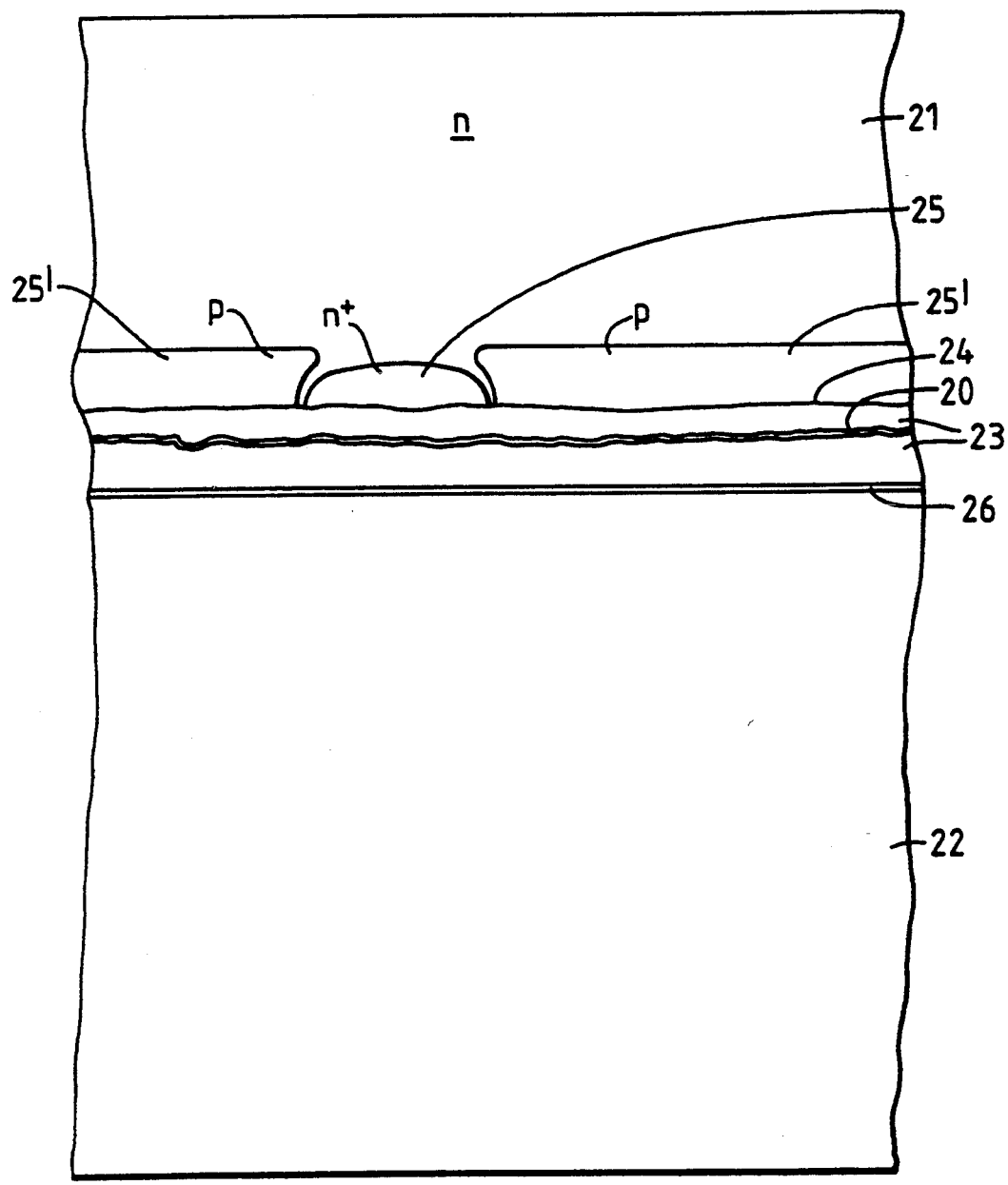
FIG. 3 is a fragmentary vertical sectional view of the structure of FIG. 2 illustrated after fusing of the solder.

During the soldering process, penetration of the aluminium-silicon solder 23 into the silicon disc 21 at its face 24 is impeded by the coating of titanium silicide 20, which has sufficiently low solubility in aluminium that it is not significantly eroded and acts as a membrane-like filter moderating the dissolution of the silicon. The integrity of the diffused-in features 25 and 25' is thereby better preserved. The dissolution of the silicon surface 24 by the aluminium-silicon solder 23 is not totally prevented by the titanium silicide barrier, but occurs to a lesser extent and quite uniformly in contrast to the irregular and non-uniformly deep dissolution found with the prior art. Possibly, the titanium silicide barrier acts to allow access of aluminium to the silicon surface but to prevent passage of silicon in the opposite direction, i.e. towards the molybdenum surface. Thereby, the thickness of any molybdenum disilicide layer 26 formed between the aluminium-silicon solder 23 and the molybdenum disc 22 during soldering is moderated by the limitation in availability of silicon at that interface as a result of the action of the titanium silicide barrier. After the operation is completed the membrane-like layer of titanium silicide is found, as shown in FIG. 3, to reside within the aluminium-silicon solder, somewhat closer to the silicon surface than to the molybdenum, its motion with time (at the alloying temperature) appearing to be in the direction of the molybdenum.

The precise thickness of the solder disc is not critical, the minimum being dictated by the need to accommodate any deviations from flatness in the faces to be joined, but it should not be greatly thicker than 50 μm. The dimensions of the silicon and the molybdenum discs are given by way of illustration only and may differ to a significant extent as may be required by other considerations.

The silicon, molybdenum and aluminium-silicon solder members of the joint structure need not be in the form of discs but could be of any appropriate shape.

The joint structure and the process for forming it may be applied to joints between silicon and members comprising other refractory metals than molybdenum, for example chromium.

The resulting fused joint assembly has been found to have a mechanical strength similar to that resulting from the prior art method while being free from the problems caused by deep and/or irregular erosion and/or deep and/or irregular dissolution of the silicon disc. The method described requires only simple additional steps to the method used in the prior art which may therefore conveniently continue in use for less critical applications concurrently with the method of the invention.

We claim:

1. A method for joining a silicon member to a member comprising a refractory metal, the method comprising:
    coating the silicon member with a layer of titanium;
    heating the silicon member and the layer of titanium to a temperature in the range from 500° to 700° C. for a time sufficient to produce a layer of titanium silicide;
    providing a layer of solder containing aluminum as the principal constituent between the layer of titanium silicide and the member comprising a refractory metal; and
    heating the solder to a temperature in the range from 577° to 760° C. to fuse it to the titanium silicide layer.

2. A method as claimed in claim 1, wherein the thickness of the layer of titanium is about 1 μm.

3. A method as claimed in claim 1, wherein the silicon member and the layer of titanium are heated to a temperature in the range from 500° to 600° C.

4. A method as claimed in claim 3, wherein the silicon member and the layer of titanium are heated to a temperature of about 550° C.

5. A method as claimed in claim 1, wherein the layer of solder is provided by compressing a solder member between the titanium silicide layer and the member comprising a refractory metal and heating the solder member to fuse it to the titanium silicide layer and the member comprising a refractory metal.

6. A method as claimed in claim 5, wherein the solder member is heated to a temperature in the range from 660° to 700° C.

7. A method as claimed in claim 6, wherein the solder member is heated to a temperature of about 690° C.

8. A method as claimed in claim 1, wherein the member comprising a refractory metal contains molybdenum as the principal constituent.

9. A method as claimed in claim 1, wherein the solder contains silicon in the range from 10 to 15% by weight.

10. A method as claimed in claim 9, wherein the solder consists of aluminum and about 11.7% silicon by weight.

11. A joint as claimed in claim 1, wherein the layer of titanium silicide is principally composed of titanium monosilicide.

12. A method as claimed in claim 1, wherein the thickness of the layer of solder is less than 50 μm.

13. A method as claimed in claim 12, wherein the thickness of the layer of solder is about 30 μm.

14. A joint which joins a silicon member to a member comprising a refractory metal, the joint consisting essentially of:
    a layer of titanium silicide formed by coating the silicon member with a layer of titanium and heating the silicon member and the layer of titanium to a temperature in the range from 500° to 700° C. for a time sufficient to produce a layer of titanium silicide adjacent the silicon member; and
    a layer of solder, containing aluminium as the principal constituent, lying between the layer of titanium silicide and the member comprising a refractory metal.

* * * * *